US011825622B2

(12) United States Patent
Smith

(10) Patent No.: US 11,825,622 B2
(45) Date of Patent: Nov. 21, 2023

(54) SINGLE-BOARD COMPUTER CARTRIDGE

(71) Applicant: Ortronics, Inc., New London, CT (US)

(72) Inventor: Daniel M. Smith, Westerly, RI (US)

(73) Assignee: Legrand DPC, LLC, West Hartford, CT (US)

( * ) Notice: Subject to any disclaimer, the term of this patent is extended or adjusted under 35 U.S.C. 154(b) by 0 days.

(21) Appl. No.: 17/523,400

(22) Filed: Nov. 10, 2021

(65) Prior Publication Data

US 2022/0151093 A1    May 12, 2022

Related U.S. Application Data

(60) Provisional application No. 63/113,069, filed on Nov. 12, 2020.

(51) Int. Cl.
*H05K 5/02*    (2006.01)
*H05K 7/14*    (2006.01)

(52) U.S. Cl.
CPC ......... *H05K 5/0286* (2013.01); *H05K 7/1427* (2013.01)

(58) Field of Classification Search
CPC .. H05K 5/0286; H05K 7/1427; H05K 5/0256; G06F 1/181; G06F 1/189; G06F 1/26; H04L 12/10
See application file for complete search history.

(56) References Cited

U.S. PATENT DOCUMENTS 10,292,296 B1 *   5/2019  Wurmfeld ............... G06F 1/186
2009/0284934 A1  11/2009  Nielsen et al.

2011/0283120 A1 * 11/2011 Sivertsen ............... G06F 3/041
                                                            713/300
(Continued)

FOREIGN PATENT DOCUMENTS

CA       3138469      11/2021
CN    207992899 U  * 10/2018
CN    207992899 U   10/2018
(Continued)

OTHER PUBLICATIONS

Extended European Search Report dated Apr. 7, 2022 for European Patent Application No. 21207765.5.
(Continued)

*Primary Examiner* — James Wu
(74) *Attorney, Agent, or Firm* — McCarter & English, LLP

(57) ABSTRACT

An example single-board computer cartridge is provided that includes a housing, a single-board computer, a Power-over-Ethernet receptacle, and a power conversion circuit board. The housing includes a front surface and a rear surface on opposing sides of the housing. The single-board computer is disposed within the housing and includes at least one data output port, the at least one data output port oriented to face the front surface of the housing. The Power-over-Ethernet receptacle is disposed within the housing and is oriented to face the rear surface of the housing. The power conversion circuit board is disposed within the housing. The power conversion circuit board is electrically connected to the single-board computer and the Power-over-Ethernet receptacle such that power and data input are provided to the single-board computer from the Power-over-Ethernet receptacle.

20 Claims, 4 Drawing Sheets

(56) References Cited

U.S. PATENT DOCUMENTS

2014/0122746 A1   5/2014   Shaver et al.
2015/0212612 A1   7/2015   Feldstein et al.

FOREIGN PATENT DOCUMENTS

| EP | 1411440 A2 * | 4/2004 | ......... G06F 13/4022 |
| EP | 21207765.5 | 11/2021 | |
| MX | a/2021/013845 | 11/2021 | |

OTHER PUBLICATIONS

U.S. Appl. No. 63/113,069, filed Nov. 12, 2020, N/A.
Raspberry Pi Product Literature, Computing for Everybody, accessed on Mar. 8, 2022, at https://www.raspberrypi.com.

* cited by examiner

SINGLE-BOARD COMPUTER CARTRIDGE

CROSS-REFERENCE TO RELATED APPLICATIONS

This application claims the benefit of a commonly assigned U.S. Provisional Patent Application No. 63/113,069, which was filed on Nov. 12, 2020. The entire content of the foregoing provisional application is incorporated herein by reference.

BACKGROUND

Single-board computers (SBCs) were initially developed for demonstration or development systems, educational systems, for use as embedded computer controllers, or the like. SBCs are built on a single circuit board and generally include microprocessor(s), memory, input and output ports, and any other features desired for the intended implementation of the SBC. Generally, SBCs include a display port, a data output port, and a Universal Serial Bus (USB) power input port for providing power to the SBC. One example of a traditional SBCs is the RASPBERRY PI®.

The advent of SBCs has led to an increase in the availability of distributed-processing for Internet-of-Things (IoT), while dramatically reducing cost of such distributed-processing systems. A variety of industries have incorporated the use of SBCs, including industrial and commercial sensing automation applications, security systems, or the like. One challenge, particularly for commercial and industrial users, has been in staging and connecting the SBCs in a distributed on-site network. Most SBCs are natively powered via the USB power input port, necessitating separate cable connections for power and data for each SBC, and a local outlet cable for the power supply. Traditional SBCs are provided without a housing, resulting in potential damage to the SBC from the environment (e.g., debris, moisture, users, combinations thereof, or the like). Keeping traditional SBCs secure from physical tampering can also be challenging within a factory, office, and/or data center environment.

SUMMARY

Embodiments of the present disclosure provide an exemplary single-board computer cartridge that provides a secure housing for SBCs and allow for a single power and data connection. The exemplary cartridge includes secondary circuit board(s) electrically connected to the SBC within the housing to adapt the SBC to be powered and network-connected through a single Power-over-Ethernet (PoE) port. The secondary circuit boards and PoE port are positioned to allow for display and data output ports to be at a front panel of the housing, while the PoE port is at the back of the housing for ease of networking. The housing can be compatible with traditional racks and/or enclosures to allow for convenient, stable, secure and environmentally-protected storage of the exemplary cartridge.

In accordance with embodiments of the present disclosure, an exemplary single-board computer cartridge is provided. The single-board computer cartridge includes a housing, a single-board computer, a Power-over-Ethernet receptacle, and a power conversion circuit board. The housing includes a front surface and a rear surface on opposing sides of the housing. The single-board computer is disposed within the housing and includes at least one data output port. The at least one data output port is oriented to face the front surface of the housing. The Power-over-Ethernet receptacle is disposed within the housing and is oriented to face the rear surface of the housing. The power conversion circuit board is disposed within the housing. The power conversion circuit board is electrically connected to the single-board computer and the Power-over-Ethernet receptacle such that power and data input are provided to the single-board computer from the Power-over-Ethernet receptacle.

The single-board computer cartridge can include a power button extending from the front surface of the housing and at least partially disposed within the housing. The power button can be electrically connected to the single-board computer, the Power-over-Ethernet receptacle, and the power conversion circuit board. The housing includes an opening formed in the front surface complementary to the at least one data port of the single-board computer. The single-board computer can include a display port oriented to face the front surface of the housing. In some embodiments, the display port can be a high-definition multimedia interface (HDMI) port. In such embodiments, the housing includes an opening formed in the front surface complementary to the display port of the single-board computer. The housing includes an opening formed in the rear surface complementary to the Power-over-Ethernet receptacle. In some embodiments, the housing can be dimensioned to fit within a rack enclosure (e.g., an LG-X enclosure, or the like). The front surface of the housing can include screws or rivets for securing the housing to the rack enclosure. In some embodiments, the rear surface of the housing can include a cutout defining a recesses area of the housing, the Power-over-Ethernet receptacle disposed within the cutout.

In accordance with embodiments of the present disclosure, an exemplary single-board computer system is provided. The system includes a rack enclosure with at least one shelf, and a single-board computer cartridge configured to be releasably positioned on the at least one shelf of the rack enclosure. The single-board computer cartridge includes a housing, a single-board computer, a Power-over-Ethernet receptacle, and a power conversion circuit board. The housing includes a front surface and a rear surface on opposing sides of the housing. The single-board computer is disposed within the housing and includes at least one data output port. The at least one data output port is oriented to face the front surface of the housing. The Power-over-Ethernet receptacle is disposed within the housing and is oriented to face the rear surface of the housing. The power conversion circuit board is disposed within the housing. The power conversion circuit board is electrically connected to the single-board computer and the Power-over-Ethernet receptacle such that power and data input are provided to the single-board computer from the Power-over-Ethernet receptacle.

In accordance with embodiments of the present disclosure, an exemplary method of fabricating a single-board computer cartridge is provided. The method includes providing a housing including a front surface and a rear surface on opposing sides of the housing, positioning a single-board computer within the housing such that at least one data output port of the single-board computer is oriented to face the front surface of the housing, positioning a Power-over-Ethernet receptacle within the housing such that the Power-over-Ethernet receptacle is oriented to face the rear surface of the housing, and positioning a power conversion circuit board within the housing. The power conversion circuit board is electrically connected to the single-board computer and the Power-over-Ethernet receptacle such that power and data input are provided to the single-board computer from the Power-over-Ethernet receptacle.

Any combination and/or permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

To assist those of skill in the art in making and using the single-board computer cartridge, reference is made to the accompanying figures, wherein.

DETAILED DESCRIPTION

Figure 1:
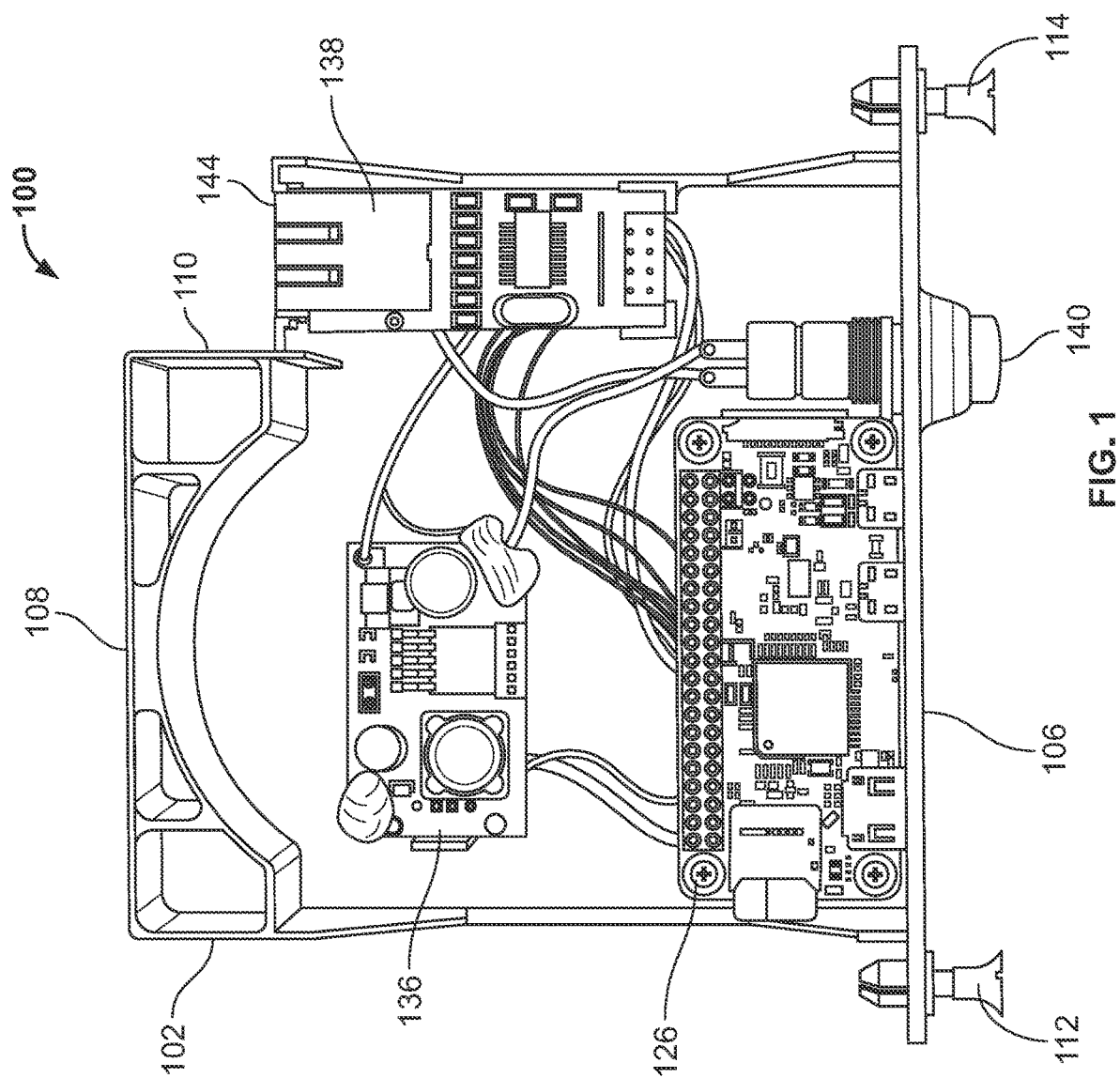
FIG. 1 is a top view of an interior of a single-board computer cartridge in an exemplary embodiment.
Figure 2:
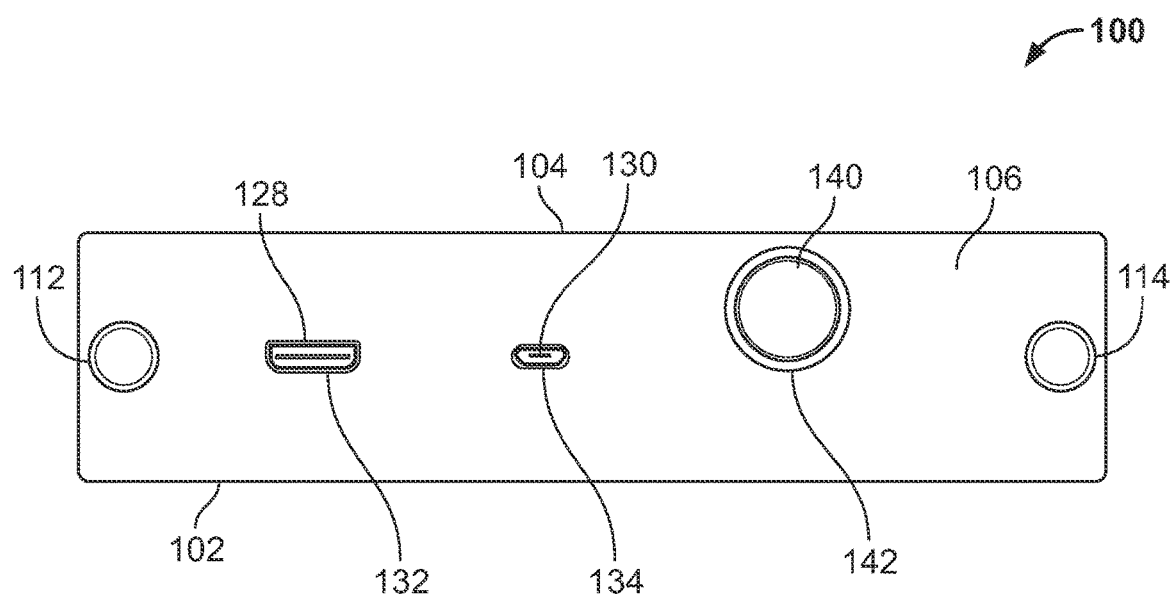
FIG. 2 is a front view of the single-board computer cartridge of FIG. 1 including a top housing cover.
Figure 3:
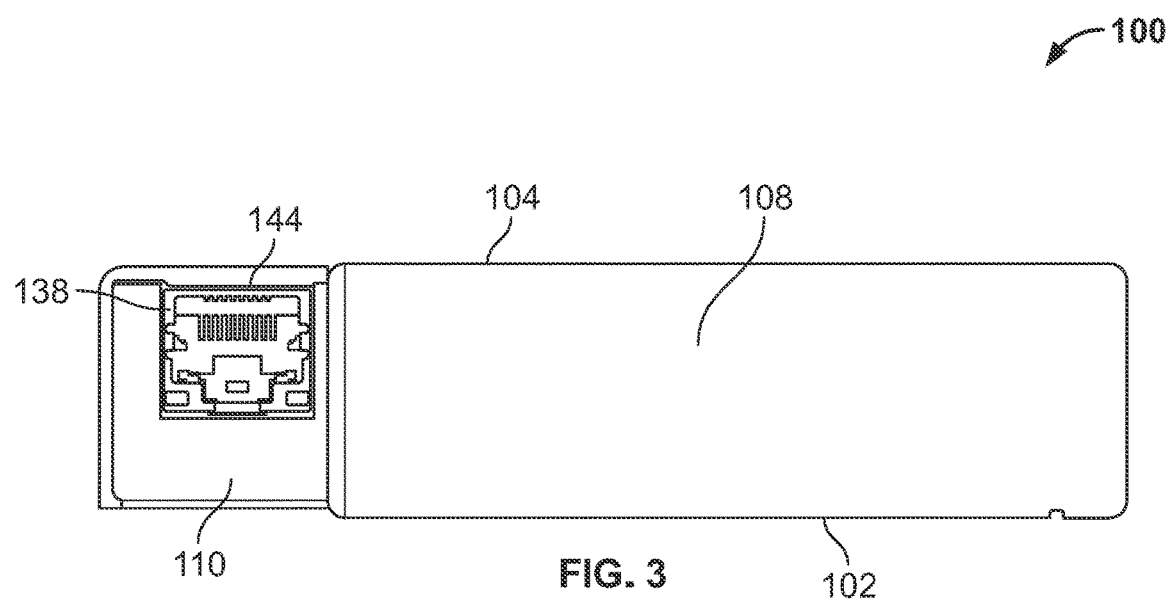
FIG. 3 is a rear view of the single-board computer cartridge of FIG. 1 including a top housing cover.
Figure 4:
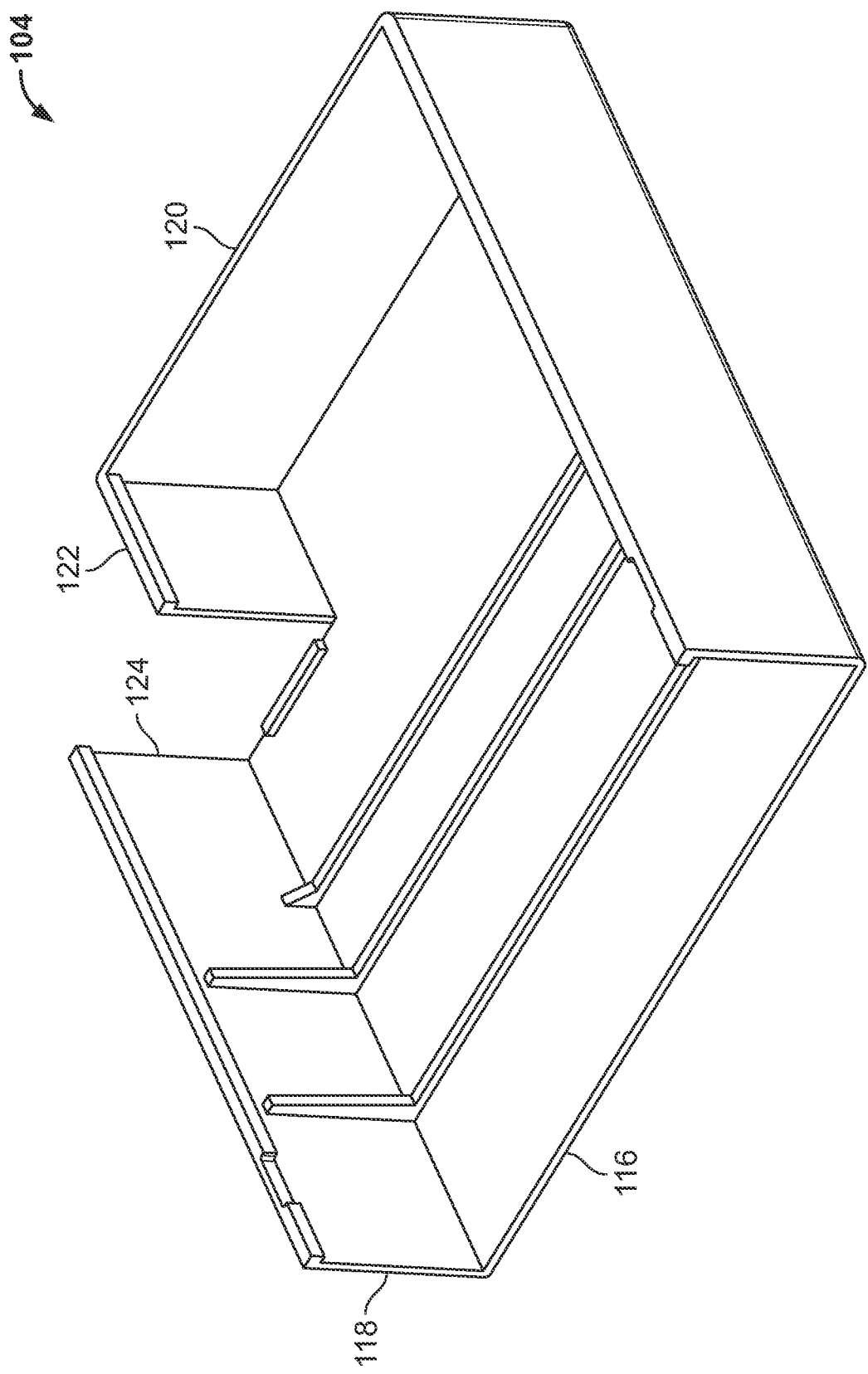
FIG. 4 is a perspective view of a housing cover for the single-board computer cartridge of FIG. 1.

FIGS. 1-3 are top, front and rear views of an exemplary single-board computer cartridge 100 (hereinafter "cartridge 100") of the present disclosure, and FIG. 4 is a perspective view of a cover 104 of a housing for the cartridge 100. The cartridge 100 can be referred to herein as a consumable unit, or the like. The cartridge 100 includes a base 102 and cover 104 of a housing capable of being detachably interlocked relative to each other to form an enclosure to substantially encase electrical components of the cartridge 100. FIG. 1 shows the cartridge 100 without the cover 104 to illustrate the internal components and/or configuration of the cartridge 100.

The base 102 includes a front panel 106 defining a front surface of the housing, and further includes a rear surface 108. The base 102 can include a cutout 110 at the rear surface 108 defining an internally recessed area of the housing. The front panel 106 includes mounting rivets 112, 114 on lateral sides of the front panel 106 for detachably securing the cartridge 100 to complementary openings in a rack enclosure. The cover 104 includes a front edge 116 with a U-shaped opening 118 configured to fit behind the front panel 106 of the base 102. The cover 104 includes a rear surface 120 including a cutout 122 defining an internally recessed area complementary to the cutout 110. The cutout 122 includes an opening 124 formed in the walls of the housing, the opening 124 configured to fit over the walls defining the cutout 110 of the base 102.

The cartridge 100 includes a single-board computer 126 (hereinafter "SBC 126") disposed on and secured to the base 102. It should be understood that the SBC 126 is provided for illustrative purposes and, in some embodiments, the SBC 126 can include a variety of components. For example, the SBC 126 shown in FIGS. 1-3 can include a display port 128 (e.g., a high-definition multimedia interface (HDMI) port, or the like), and a data output USB port 130. The base 102 includes openings 132, 134 formed in the front panel 106 that align with and at least partially receive the ports 128, 130. The SBC 126 is positioned within the base 102 such that the ports 128, 130 are oriented toward the front of the cartridge 100, allowing the ports 128, 130 to be conveniently accessed from the front of the cartridge 100.

The cartridge 100 includes a power conversion circuit board 136, a Power-over-Ethernet (PoE) compatible receptacle 138, and a power switch or button 140. The circuit board 136, receptacle 138, and button 140 are electrically interconnected relative to each other and relative to the SBC 126. The power conversion circuit board 136 adapts the SBC 126 to be powered by a PoE cable instead of a dedicated USB power input cable. Specifically, the PoE connector can be electrically connected to the receptacle 138 to provide network data and power to be transmitted over a single cable connection to the cartridge 100. In some embodiments, the power conversion circuit board 136 can include a cooling fan. The power button 140 allows for the entire cartridge 100 to be turned on and off.

The power button 140 is positioned within a complementary opening 142 formed in the front panel 106 to provide convenient access to the user from the front of the cartridge 100. The receptacle 138 is positioned within the housing to face rearward and through an opening 144 formed in the cutout 110 of the base 102. The rearwardly facing receptacle 138 allow for convenient connection of a PoE connector (e.g., an RJ-45 connector) at the rear of the cartridge 100 when the cartridge 100 is positioned within a rack enclosure. The receptacle 138 is therefore on the opposing side of the cartridge 100 from the ports 128, 130. The cutout 110, 122 in the housing creates a recessed area that provides added protection to the RJ-45 connector and/or cable.

Figure 5:
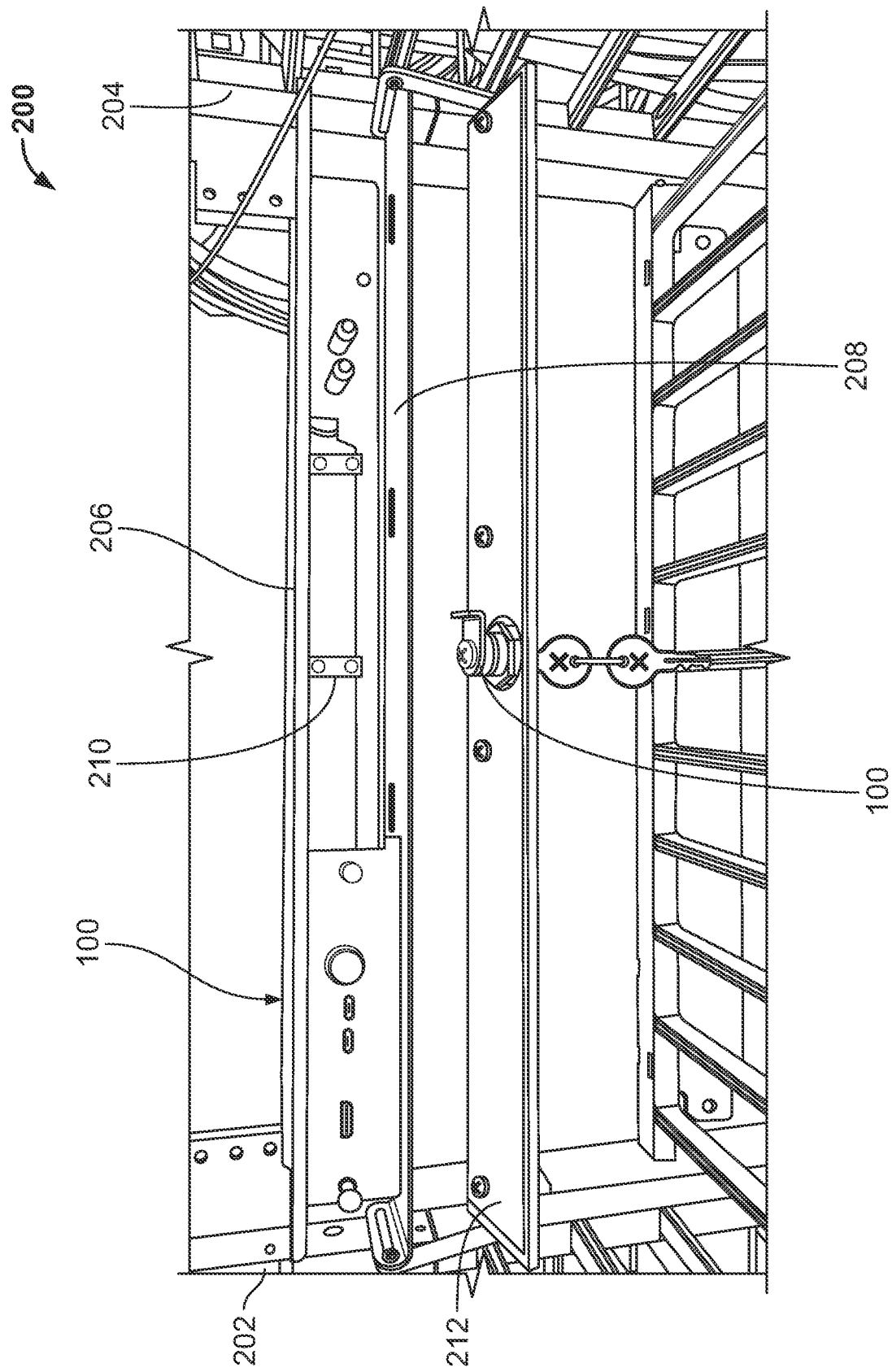
FIG. 5 is a front view of a single-board computer cartridge positioned within an enclosure rack in an exemplary embodiment.

FIG. 5 is a front view of the cartridge 100 positioned within a rack enclosure 200 (e.g., an LG-X enclosure, or the like). The rack enclosure 200 can include lateral, vertical structural supports 202, 204, and one or more shelf assemblies including top and bottom shelves 206, 208. The shelf assembly can include vertical supports 210 with threaded openings configured to receive the mounting rivets 112, 114 of the cartridge 100. In some embodiments, the rack enclosure 200 can include a front panel or door 212 with a lock 214 for securely covering and protecting the front of the network components disposed on the shelf assembly.

The housing for the cartridge 100 can be configured and dimensioned per industry standards to be compatible with and fit within the rack enclosure 200, and be detachably secured to the shelf assembly. Specifically, the housing for the cartridge 100 allows for the SBC 126 and electrical components to be enclosed within the footprint of an industry standard form. The rack enclosure 200 can offer both protection and security for the components inside of the cartridge 100, and can enable freer access to front patching (which may need to be serviced often) while restricting access behind the panel or door 212, where components and connections may need to be more secure. In some embodiments, multiple cartridges 100 can be electrically connected or ganged together to increase the processing power (as compared to the processing power of a single SBC 126).

The exemplary cartridge 100 therefore provides the opportunity for securely and conveniently using SBCs 126 with a single electrical connection for both data and power, and optionally positioning the cartridge 100 within a rack enclosure 200 used in the industry. Such opportunity is provided by modifying the power configuration of the SBC 126 to a PoE connection, and distributing the electrical components within the housing such that display and data ports 128, 130 face towards the front of the cartridge 100 while the PoE receptacle 138 faces towards the rear of the cartridge 100. A separate USB power cable is therefore unnecessary for operating the cartridge 100, and the PoE receptacle allows for the power source to be spaced further from the cartridge 100. The precise opposing orientation of the ports 128, 130 and the receptacle 138 provides the desired functionality of the cartridge 100 in a compact, lightweight form.

The industry standard sizing of the housing for the cartridge 100 allows for widespread, low-cost rack enclosures 200 (e.g., legacy LG-X enclosures, or the like) to become staging locations for distributed IoT infrastructure, providing a stable, secure, and environmentally-protected platform which necessitates only network PoE cabling to connect. In some embodiments, the cartridge 100 can be used for pure-IoT, non-fiber end users. In some embodiments, the cartridge 100 can be used for a variety of users. The cartridge 100 can enable existing fiber enclosures to add programmable powered devices to their existing enclosures. In some embodiments, a USB interface associated with a computer can provide power for network-programmable lighting, sensors, and/or cameras which could be used to enhance the serviceability and/or security of existing fiber installations, without the need to run additional power cables.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. A single-board computer cartridge, comprising:
a housing including a front surface and a rear surface on opposing sides of the housing;
a single-board computer disposed within the housing and including at least one data output port and a power input port, the at least one data output port oriented to face the front surface of the housing, wherein the single-board computer is configured to receive power through the power input port and configured to transmit data through the at least one data output port;
a Power-over-Ethernet receptacle disposed within the housing and oriented to face the rear surface of the housing; and
a power conversion circuit board disposed within the housing, the power conversion circuit board electrically connecting the single-board computer to the Power-over-Ethernet receptacle and adapting the single-board computer such that both power and data input are provided to the single-board computer from the Power-over-Ethernet receptacle;
wherein the front surface of the housing includes fasteners for detachably securing the housing to an enclosure.

2. The single-board computer cartridge of claim 1, comprising a power button extending from the front surface of the housing and at least partially disposed within the housing.

3. The single-board computer cartridge of claim 2, wherein the power button is electrically connected to the single-board computer, the Power-over-Ethernet receptacle, and the power conversion circuit board.

4. The single-board computer cartridge of claim 1, wherein the housing includes an opening formed in the front surface complementary to the at least one data port of the single-board computer.

5. The single-board computer cartridge of claim 1, wherein the single-board computer includes a display port oriented to face the front surface of the housing.

6. The single-board computer cartridge of claim 5, wherein the display port is a high-definition multimedia interface (HDMI) port.

7. The single-board computer cartridge of claim 5, wherein the housing includes an opening formed in the front surface complementary to the display port of the single-board computer.

8. The single-board computer cartridge of claim 1, wherein the housing includes an opening formed in the rear surface complementary to the Power-over-Ethernet receptacle.

9. The single-board computer cartridge of claim 1, wherein the enclosure is a rack enclosure, and the housing is dimensioned to fit within the rack enclosure.

10. The single-board computer cartridge of claim 9, wherein the rack enclosure is an LG-X enclosure.

11. The single-board computer cartridge of claim 1, wherein the fasteners of the front surface of the housing are rivets for securing the housing to the enclosure.

12. The single-board computer cartridge of claim 1, wherein the rear surface of the housing includes a cutout defining a recesses area of the housing, the Power-over-Ethernet receptacle disposed within the cutout.

13. A single-board computer system, comprising:
a rack enclosure including at least one shelf; and
a single-board computer cartridge configured to be positioned on the at least one shelf of the rack enclosure, the single-board computer cartridge including:
a housing including a front surface and a rear surface on opposing sides of the housing;
a single-board computer disposed within the housing and including at least one data output port and a power input port, the at least one data output port oriented to face the front surface of the housing, wherein the single-board computer is configured to receive power through the power input port and configured to transmit data through the at least one data output port;
a Power-over-Ethernet receptacle disposed within the housing and oriented to face the rear surface of the housing; and
a power conversion circuit board disposed within the housing, the power conversion circuit board electrically connecting the single-board computer to the Power-over-Ethernet receptacle and adapting the single-board computer such that both power and data input are provided to the single-board computer from the Power-over-Ethernet receptacle;
wherein the front surface of the housing includes fasteners for detachably securing the housing to an enclosure.

14. The system of claim 13, wherein the rack enclosure is an LG-X enclosure.

15. The system of claim 13, wherein the single-board computer cartridge includes a power button extending from the front surface of the housing and at least partially disposed within the housing.

16. The system of claim 15, wherein the power button is electrically connected to the single-board computer, the Power-over-Ethernet receptacle, and the power conversion circuit board.

17. The system of claim 13, wherein the housing includes an opening formed in the front surface complementary to the at least one data port of the single-board computer.

18. The system of claim 13, wherein the single-board computer includes a display port oriented to face the front surface of the housing.

19. The system of claim 13, wherein the housing includes an opening formed in the rear surface complementary to the Power-over-Ethernet receptacle.

20. A method of fabricating a single-board computer cartridge, the method comprising:
- providing a housing including a front surface and a rear surface on opposing sides of the housing;
- positioning a single-board computer within the housing such that at least one data output port of the single-board computer is oriented to face the front surface of the housing, the single-board computer including a power input port, and the single-board computer is configured to receive power through the power input port and configured to transmit data through the at least one data output port;
- positioning a Power-over-Ethernet receptacle within the housing such that the Power-over-Ethernet receptacle is oriented to face the rear surface of the housing;
- electrically connecting the single-board computer to the Power-over-Ethernet receptacle with a power conversion circuit board such that both power and data input are provided to the single-board computer from the Power-over-Ethernet receptacle; and
- detachably securing the housing to an enclosure with fasteners disposed in the front surface of the housing.

\* \* \* \* \*